United States Patent
Savithri

(10) Patent No.: US 9,885,750 B1
(45) Date of Patent: Feb. 6, 2018

(54) SPEED MODEL TUNING FOR PROGRAMMABLE INTEGRATED CIRCUITS WITH CONSIDERATION OF DEVICE YIELD, SIMULATED FREQUENCY OF OPERATION, AND SPEED OF DEVICE COMPONENTS

(71) Applicant: Xilinx, Inc., San Jose, CA (US)

(72) Inventor: Nagaraj Savithri, Plano, TX (US)

(73) Assignee: XILINX, INC., San Jose, CA (US)

( * ) Notice: Subject to any disclaimer, the term of this patent is extended or adjusted under 35 U.S.C. 154(b) by 355 days.

(21) Appl. No.: 14/750,049

(22) Filed: Jun. 25, 2015

(51) Int. Cl.
- G06F 17/50 (2006.01)
- G01R 31/317 (2006.01)
- H03K 19/177 (2006.01)

(52) U.S. Cl.
CPC . G01R 31/31718 (2013.01); G01R 31/31725 (2013.01); H03K 19/17748 (2013.01)

(58) Field of Classification Search
CPC ............. G06F 17/5027; G06F 17/5054; G01R 31/31725; H03K 19/17792
USPC ......................................... 716/110, 116, 117
See application file for complete search history.

(56) References Cited

U.S. PATENT DOCUMENTS

| | | | | |
|---|---|---|---|---|
| 5,456,604 A * | 10/1995 | Olmsted et al. | ....... | G09B 9/048 434/29 |
| 9,065,446 B1 * | 6/2015 | Savithri et al. | .. | H03K 19/17792 |
| 9,372,948 B1 * | 6/2016 | Savithri | .......... | G01R 31/31725 |
| 9,639,640 B1 * | 5/2017 | Savithri et al. | ..... | G06F 17/5031 |

* cited by examiner

*Primary Examiner* — Sun Lin
(74) *Attorney, Agent, or Firm* — Joshua Hamberger; Keith Taboada

(57) ABSTRACT

Techniques for intelligent tuning of speed models for configurable integrated circuits. The techniques consider data related to yield, quality-of-results, and data for individual programmable-interconnect-point (PIP)-contexts. More specifically, the speed of yield-related structures, quality-of-results related structures, and structures for measuring individual PIP-contexts are measured. These measurements are compared with estimated values stored as part of a speed model and scaling factors for the stored estimated values are calculated. The scaling factors are applied to the estimated values within the speed model and measurements are repeated if desired.

20 Claims, 8 Drawing Sheets

| PIP-Context Speed Data 192 | | | | | | | | PIP-Context Delay Data 212 | |
|---|---|---|---|---|---|---|---|---|---|
| PIP-Context Type Specifiers 210 | | | | | | | | | |
| Context ID | Driver PIP Type | Driver Node Type | Pre-Driver PIP Type | Pre-Driver Node Type | Dominant Metal Layer | Tile Crossing Data | Slew and Capacitor Bins | Node Delay Data | PIP Delay Data |
| Context ID | Driver PIP Type | Driver Node Type | Pre-Driver PIP Type | Pre-Driver Node Type | Dominant Metal Layer | Tile Crossing Data | Slew and Capacitor Bins | Node Delay Data | PIP Delay Data |
| Context ID | Driver PIP Type | Driver Node Type | Pre-Driver PIP Type | Pre-Driver Node Type | Dominant Metal Layer | Tile Crossing Data | Slew and Capacitor Bins | Node Delay Data | PIP Delay Data |
| Context ID | Driver PIP Type | Driver Node Type | Pre-Driver PIP Type | Pre-Driver Node Type | Dominant Metal Layer | Tile Crossing Data | Slew and Capacitor Bins | Node Delay Data | PIP Delay Data |
| ... | | | | | | | | | |
| Context ID | Driver PIP Type | Driver Node Type | Pre-Driver PIP Type | Pre-Driver Node Type | Dominant Metal Layer | Tile Crossing Data | Slew and Capacitor Bins | Node Delay Data | PIP Delay Data |

SPEED MODEL TUNING FOR PROGRAMMABLE INTEGRATED CIRCUITS WITH CONSIDERATION OF DEVICE YIELD, SIMULATED FREQUENCY OF OPERATION, AND SPEED OF DEVICE COMPONENTS

TECHNICAL FIELD

Examples of the present disclosure generally relate to programmable integrated circuits and, in particular, to speed model tuning for programmable integrated circuits with consideration of device yield, simulated frequency of operation, and speed of device components.

BACKGROUND

Programmable integrated circuits such as field programmable gate arrays offer a large amount of flexibility in that a single device may be configured to implement a wide array of different circuits. Part of the design process for programmable integrated circuits is speed modeling, which involves, among other things, obtaining accurate speed parameters for various components of the programmable integrated circuit. These parameters may be important for improving circuit model design and for simply characterizing the speed of the programmable integrated circuit as a whole.

Speed parameters are typically simulated and saved in speed model data. Simulated speed model data may not be accurate and thus may need to be "tuned." In the past, tuning was done manually, which was a very tedious process. For these reasons, improved techniques for tuning speed parameters of programmable integrated circuits are needed.

SUMMARY

A speed model tuning system is provided. The speed model tuning system comprises a programmable-interconnect-point (PIP) speed testing module operable to take over-and-under-report measurements for PIP-contexts of an integrated circuit. The speed model tuning system also comprises a yield testing module operable to take yield-based speed measurements associated with the integrated circuit. The speed model tuning system further comprises a quality-of-results (QoR) testing module operable to take QoR-based speed measurements associated with a circuit model for being programmed into the integrated circuit. The speed model tuning system also comprises a scale factor generator operable to generate scale factors for the PIP-contexts of the integrated circuit based on the over-and-under-report measurements, the yield-based speed measurements, and the QoR-based speed measurements.

A method for tuning a speed model is provided. The method includes taking over-and-under-report measurements for programmable-interconnect-point (PIP)-contexts of an integrated circuit. The method also includes taking yield-based speed measurements associated with the integrated circuit. The method further includes taking quality-of-results (QoR)-based speed measurements associated with a circuit model for being programmed into the integrated circuit. The method also includes generating scale factors for the PIP-contexts of the integrated circuit based on the over-and-under-report measurements, the yield-based speed measurements, and the QoR-based speed measurements.

A non-transitory computer-readable medium storing instructions that, when executed by a processor, cause the processor to perform a method. The method includes taking over-and-under-report measurements for programmable-interconnect-point (PIP)-contexts of an integrated circuit. The method also includes taking yield-based speed measurements associated with the integrated circuit. The method further includes taking quality-of-results (QoR)-based speed measurements associated with a circuit model for being programmed into the integrated circuit. The method also includes generating scale factors for the PIP-contexts of the integrated circuit based on the over-and-under-report measurements, the yield-based speed measurements, and the QoR-based speed measurements.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting in scope.

FIG. 2B is an illustration of PIP-context speed data, according to an example.

To facilitate understanding, identical reference numerals have been used, where possible, to designate identical elements that are common to the figures. It is contemplated that elements of one example may be beneficially incorporated in other examples.

DETAILED DESCRIPTION

Figure 1A:
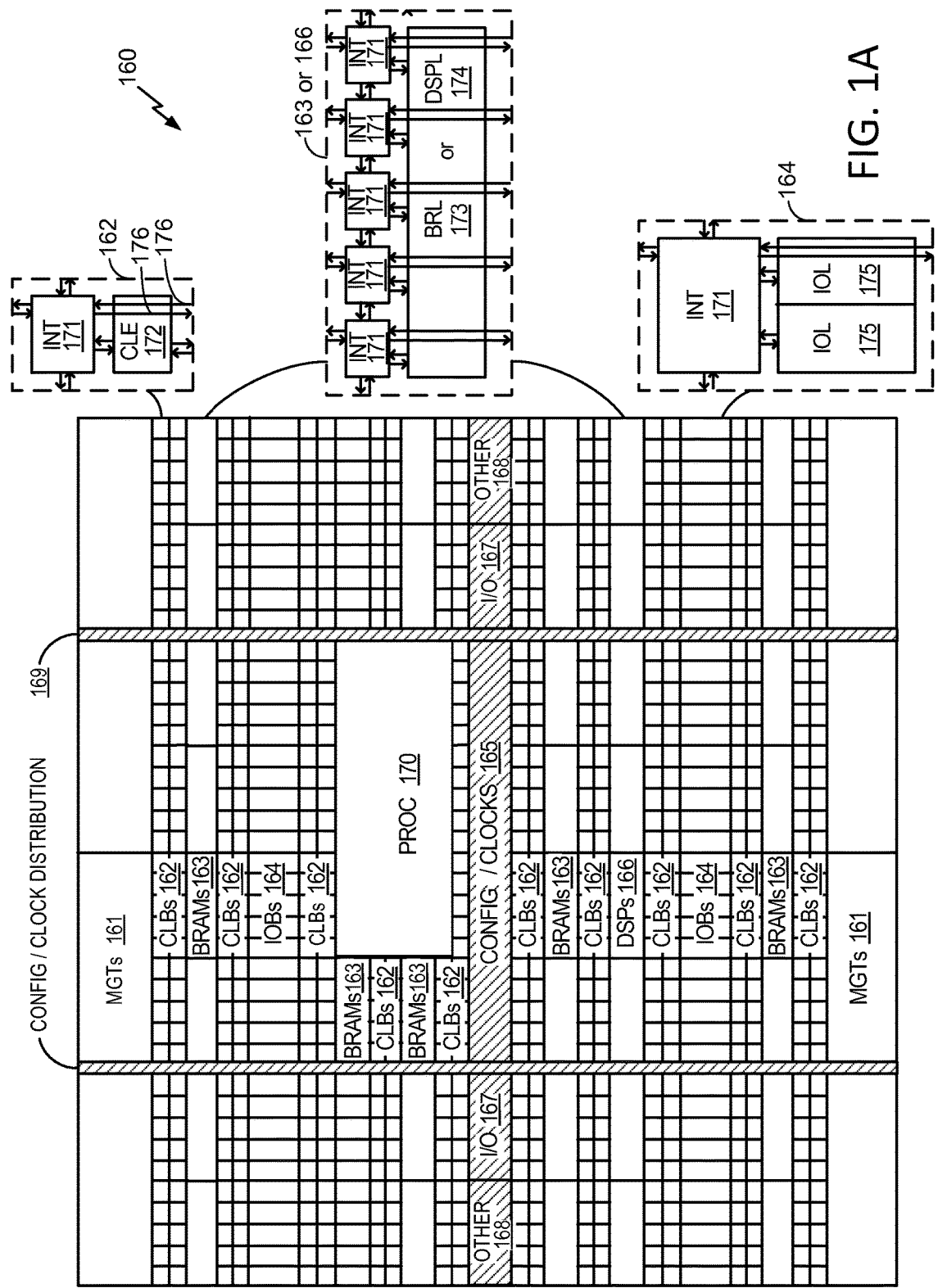
FIG. 1A illustrates an integrated circuit, according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated, or if not so explicitly described.

Examples disclosed herein include a system for tuning speed data for a programmable integrated circuit. The system obtains yield-based measurements, quality-of-resultsbased measurements, and over-and-under-reports-based measurements, and compares these measurements to simulated results. The system updates the speed data based on these comparisons.

FIG. 1A illustrates an integrated circuit 160 (also referred to as a "programmable integrated circuit"), according to an example. Integrated circuit ("IC") 160 includes a large number of different programmable tiles including multi-gigabit transceivers ("MGTs") 161, configurable logic blocks ("CLBs") 162, random access memory blocks ("BRAMs") 163, input/output blocks ("IOBs") 164, configuration and clocking logic ("CONFIG/CLOCKS") 165, digital signal processing blocks ("DSPs") 166, specialized input/output blocks ("I/O") 167 (e.g., configuration ports and clock ports), and other programmable logic 168 such as digital clock managers, analog-to-digital converters, system monitoring logic, and so forth. The IC 160 may include a field programmable gate array ("FPGA") architecture. IC 160 also includes a dedicated processor, also referred to as a "processing system" or "PROC" 170.

Optionally, each programmable tile includes a programmable interconnect element ("INT") 171 (also referred to herein as a "programmable interconnect point" or "PIP") having standardized connections to and from a corresponding interconnect element in other tiles. The programmable interconnect elements taken together implement the programmable interconnect structure (or "programmable interconnect fabric") for the illustrated IC 160. The programmable interconnect element 171 also includes the connections to and from the programmable logic element within the same tile, as shown by the examples included at the top of FIG. 1A.

For example, a CLB 162 can include a configurable logic element ("CLE") 172 that can be programmed to implement user logic plus a single programmable interconnect element ("INT") 171. A BRAM 163 can include a BRAM logic element ("BRL") 173 in addition to one or more programmable interconnect elements 171. Typically, the number of interconnect elements 171 included in a tile depends on the height of the tile. In the pictured IC 160, a BRAM tile 163 has the same height as five CLBs 162, but other numbers (e.g., four) can also be used. A DSP tile 166 can include a DSP logic element ("DSPL") 174 in addition to an appropriate number of programmable interconnect elements 171. An 1OB 164 can include, for example, two instances of an input/output logic element ("IOL") 175 in addition to one instance of the programmable interconnect element 171. The programmable interconnect elements 171 are selectively coupled to interconnects 176, which are conductors that traverse one or more tiles. As will be clear to those of skill in the art, the actual I/O pads connected, for example, to the I/O logic element 175 typically are not confined to the area of the input/output logic element 175.

In the pictured IC 160, a horizontal area near the center of the die is used for configuration, clock, I/O 167, and other control logic. Vertical columns 169 extending from this horizontal area or column are used to distribute the clocks and configuration signals across the breadth of the IC 160.

Optionally, IC 160 includes additional logic blocks that disrupt the regular columnar structure making up a large part of the IC. The additional logic blocks can be programmable blocks and/or dedicated logic. For example, processor block 170 spans several columns of CLBs and BRAMs.

PROC 170 can be implemented as a hard-wired processor that is fabricated as part of the die that implements the programmable circuitry of the IC 160 and does not include the programmable tiles included within the PL domain. PROC 170 can represent any of a variety of different processor types and/or systems ranging in complexity from an individual processor, e.g., a single core capable of executing program code, to an entire processor system having one or more cores, modules, co-processors, interfaces, or the like.

In a more complex arrangement, for example, PROC 170 can include one or more cores, e.g., central processing units, cache memories, a memory controller, unidirectional and/or bidirectional interfaces configurable to couple directly to I/O pins, e.g., I/O pads, of the IC 160 and/or couple to the programmable circuitry of the IC 160. The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC 160. For example, portions shown in FIG. 1A that are external to PROC 170 can be considered part of the, or the, programmable circuitry of the IC 160.

Note that FIG. 1A is intended to illustrate only an exemplary IC 160 architecture. For example, the numbers of logic blocks in a row, the relative width of the rows, the number and order of rows, the types of logic blocks included in the rows, the relative sizes of the logic blocks, and the interconnect/logic implementations included at the top of FIG. 1A are purely exemplary. For example, in an actual IC 160 more than one adjacent row of CLBs 162 is typically included wherever the CLBs 162 appear, to facilitate the efficient implementation of user logic, but the number of adjacent CLB 162 rows varies with the overall size of the IC 160.

Part of the process of designing circuit models for configuration into programmable integrated circuits such as integrated circuit 160 is characterizing the speed of the integrated circuit 160 and of the circuit model that is being configured into the integrated circuit 160. One aspect of speed is related to the programmable interconnect elements 171. More specifically, because signals propagate between the various components of integrated circuit 160 via the PIPs 171, it is beneficial to have accurate knowledge of the speed with which signals propagate through PIPs 171. Moreover, while simulation software may store estimated speed data for the PIPs 171, this estimated speed data is often incorrect and must be tuned. Tuning accounts for what are called "under-reports" and "over-reports," which refer to the degree to which the stored delay value for the various PIPs 171 (more specifically, the contexts in which the PIPs 171 are used or "PIP-contexts" as discussed below) differ from actual delays of the PIPs 171.

In addition to under-reports and over-reports, tuning also preferably accounts for both yield and quality of results ("QoR") as well as. Yield is defined as the percentage of integrated circuits 160 that meet particular frequency-of-operation goals and quality of results is the maximum theoretical frequency of a circuit model to be programmed into IC 160. For both yield and quality of results, frequency refers to the global clock signal that clocks the clockable storage elements of the circuit model. For yield, frequency-of-operation goals may be a tiered set of goals. In one example, frequency-of-operation goals may specify that 50% of ICs 160 need to run at 1,000 Mhz, 25% need to run at 750 Mhz, and 25% need to run at 500 Mhz. An example quality of results goal is that the circuit should theoretically be able to run at a maximum frequency of 1,000 Mhz. The "theoretical" speed is defined as the speed that corresponds to the QoR-critical path having the highest delay. A QoR-critical path exists for each pair of input and output clocked storage elements in the circuit model and is the sequence of circuit elements having the highest delay between those two clocked storage elements. The slowest QoR-critical path defines the theoretical speed of the circuit model.

Figure 1B:
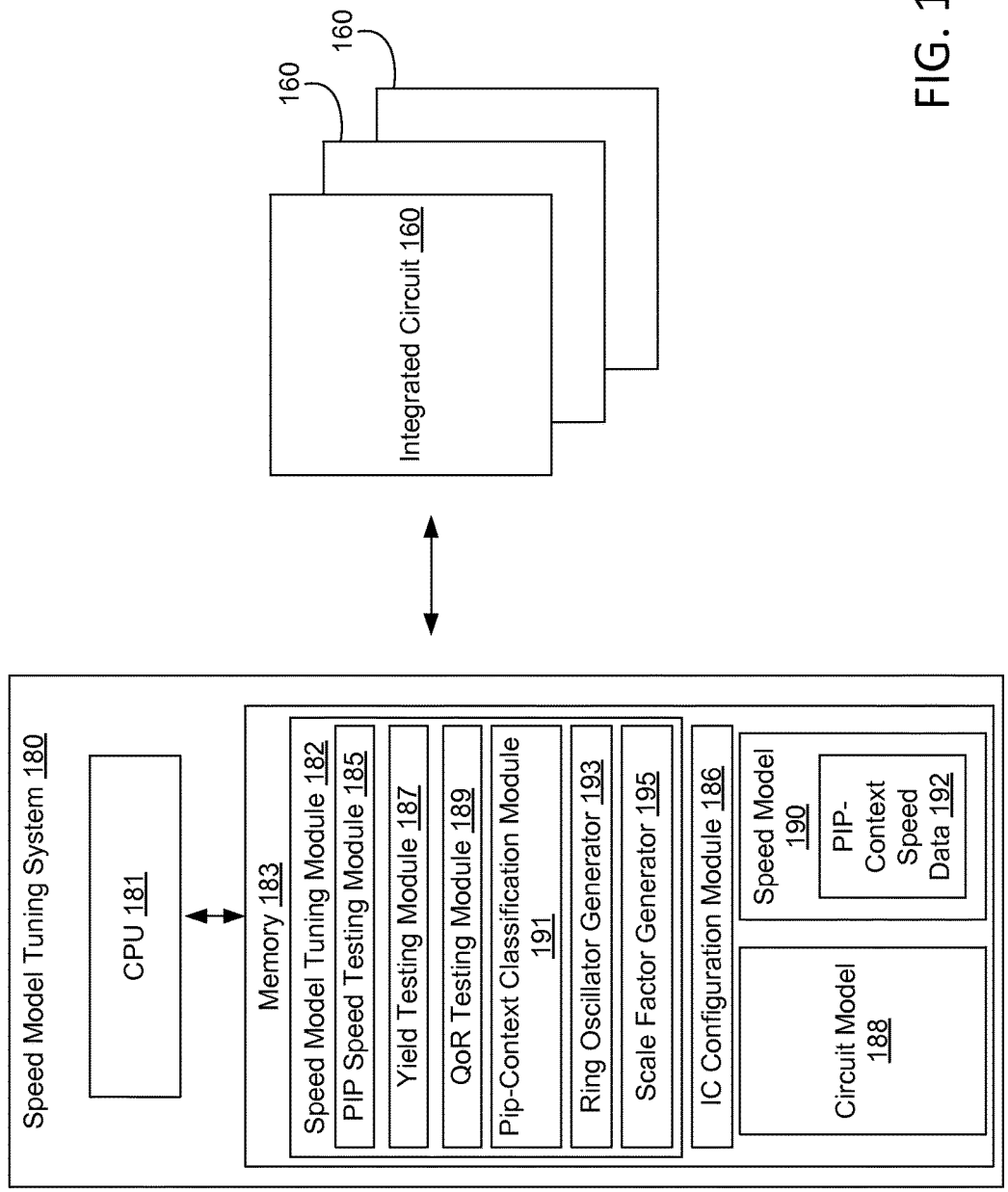
FIG. 1B is an illustration of a speed model tuning system 180 for tuning speed data related to programmable interconnect points (PIPs) and interconnects of programmable integrated circuits, according to an example.

FIG. 1B is an illustration of a speed model tuning system 180 for tuning speed data related to PIPs 171 and interconnects 176 of programmable integrated circuits 160, according to an example. As shown, the speed model tuning system 180 includes a central processing unit ("CPU") 181 coupled to a memory 183. The CPU 181 executes instructions stored in the memory 183. The memory 183 stores data and instructions for execution by CPU 181. Speed model tuning system 180 may include additional computer components such as bridges, non-volatile storage, input/output devices, and the like. The various modules discussed as being included in memory 183 below may be implemented in any technically feasible manner, including as software components, hardware components, or a combination thereof.

Although shown as a computer with CPU 181 and memory 183, in various alternative embodiments, the speed model tuning system 180 may be any device capable of performing the operations described herein. In one example, speed model tuning system 180 may be an application specific integrated circuit ("ASIC"). Speed model tuning system 180 may be implemented in various other technically feasible manners.

The memory 183 includes (e.g., as executable computer code) a speed model tuning module 182, an IC configuration module 186, a circuit model 188, and a speed model 190. The IC configuration module 186 configures ICs 160 with a circuit based on instructions from speed model tuning module 182 or based on the circuit model 188. The circuit model 188 may be a "customer design" or a functional design that is to be programmed into the IC 160 as requested by a party such as a third party customer or the like. The speed model tuning module 182 includes a PIP speed testing module 185, a yield testing module 187, a quality of results ("QoR") testing module 189, a PIP-context classification module 191, a ring oscillator generator 193, and a scale factor generator 195. The speed model 190 includes pip-context speed data 192.

The speed model tuning module 182 iteratively tunes speed model 190 based at least in part on measurements taken from one or more integrated circuits 160 that are coupled to speed model tuning system 180. More specifically, speed model tuning module 182 performs multiple rounds or iterations of a tuning process that adjusts delay values within speed model 190. The iterations end when the speed model 190 is deemed to be sufficiently accurate for yield, QoR, and for each PIP-context group. Speed model 190 may be deemed to be sufficiently accurate when the actual yield, the quality of results, and the PIP-context group measurements are within a threshold percentage of the corresponding simulated values as defined by the speed model 190.

Speed model 190 includes PIP-context speed data 192, which includes "PIP-context speed data entries" (discussed in further detail with respect to FIG. 2B) that indicate the delay values for different PIP-contexts, which are the "contexts" in which PIPs 171 are used. The "context" of a PIP 171 may include various characteristics of the PIP 171 and surrounding elements, such as the type of PIP 171 and which other elements, such as interconnects 176, the PIP 171 is coupled to. Because the context of a PIP 171 may affect the speed of a PIP 171, characterizing the speed of PIP-contexts (and not just individual PIPs 171 in isolation) provides an understanding of the speed of different elements of the interconnect fabric of an IC 160. PIP-contexts and speed data for PIP-contexts are described in greater detail below with respect to FIGS. 2A and 2B. In some examples, the PIP-context speed data 192 includes one entry for each possible PIP-context. In addition to data for PIP-contexts, speed model 190 also includes delay data for other elements such as functional logical elements of CLBs 162 (for, e.g., creating logic gates), flip flops, and other elements. PIP-contexts are now described in more detail.

Figure 2A:
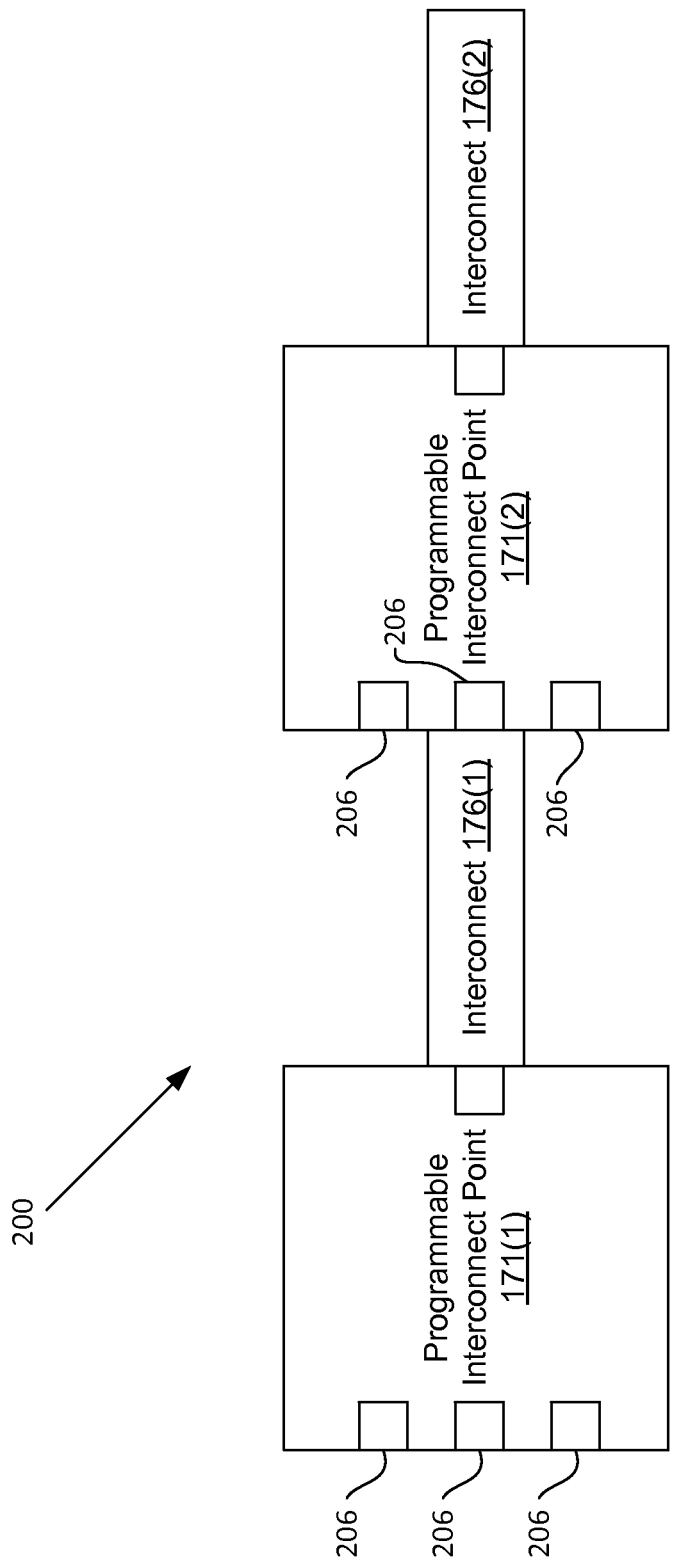
FIG. 2A is an illustration of a PIP-context, according to an example.

FIG. 2A is an illustration of a PIP-context 200, according to an example. As shown, the PIP-context 200 includes a first PIP 171(1), a first interconnect 176(1), a second PIP 171(2), and a second interconnect 176(2). Herein, the first PIP 171(1) may be referred to as a "pre-driver PIP" and the first interconnect 176(1) may be referred to as a "pre-driver interconnect" or "pre-driver node." The second PIP 171(2) may be referred to herein as a "driver PIP" and the second interconnect 176(2) may be referred to herein as a "driver interconnect" or "driver node."

Note that although two PIPs 171 are illustrated in FIG. 2A, the PIP-context 200 is a construct for testing the speed of the second PIP 171(2) and the second interconnect 176(2), rather than the first PIP 171(1) and/or first interconnect 176(1). In other words, the construct illustrated in FIG. 2A, when tested, provides speed data for the driver PIP 171(2) and driver node 176(2), and not the pre-driver PIP 171(1) or pre-driver node 176(2). The reason that the first PIP 171(1) and first interconnect 176(1) are included in PIP-context 200 is that these elements, along with the second interconnect 176(2), affect the speed of the second PIP 171(2). In other words, the context in which the second PIP 171(2) is used includes the PIP 171 that provides the signal that drives the interconnect 176 that drives the second PIP 171(2).

A PIP-context includes more than just the pre-driver PIP 171(1) and pre-driver node 176(1), however. Specifically, a PIP-context 200 includes the following characteristics: the type of the driver PIP 171(2), the type of the driver interconnect 176(2), the type of the pre-driver interconnect 176(1), the type of the pre-driver PIP 171(1), the tile types crossed by the pre-driver interconnect 176(1), the tile types crossed by the driver interconnect 176(2), a slew bin for a PIP partial context, a capacitor bin for the PIP partial context, and the dominant metal layer. As stated above, the speed for each of a variety of PIP-contexts, each with different characteristics, may be stored in PIP-context speed data 192 (FIG. 1B). These characteristics are now described in greater detail.

The types of the driver PIP 171(2) and the pre-driver PIP 171(1) indicate how many inputs these PIPs 171 have. For example, both driver PIP 171(2) and pre-driver PIP 171(1) may have 3 inputs, 2 inputs, 4 inputs, and so on. In other examples, driver PIP 171(2) and pre-driver PIP 171(1) may have different numbers of inputs. The type of the driver PIP 171(2) and pre-driver PIP 171(1) may also include the number of outputs those PIPs 171 have.

The types of the driver interconnect 176(2) and the pre-driver interconnect 176(1) indicate how many tiles the interconnects 176 cross. For example, the type of the driver interconnect 176(2) may indicate that that interconnect 176(2) crosses one tile, two tiles, four tiles, five tiles, and so on. Similarly, the type of the pre-driver interconnect 176(1) may indicate that that interconnect 176(1) crosses one tile, two tiles, four tiles, five tiles, and so on.

The tile types crossed by the pre-driver interconnect 176(1) and the driver interconnect 176(2) indicate which of the tile types discussed with respect to FIG. 1A are crossed by the interconnects 176(1). In one example, the pre-driver interconnect 176(1) crosses a CLB 162 tile and a BRAM 163 tile. This defines one tile type. In another example, the pre-driver interconnect 176(1) crosses a DSP 166 tile and a CLB 162 tile. This defines another tile type.

The slew bin for a PIP partial context indicates a "bin" or grouping that characterizes the slew rate of the PIP partial context associated with the PIP-context 200 of FIG. 2A. A PIP partial context comprises the following parameters: types of pre-driver PIP 171(1) and driver PIP 171(2) and tile types crossed by the pre-driver interconnect 176(1) and the driver interconnect 176(2). Each PIP partial context has a characteristic slew rate at the input of the driver PIP 171(2). This slew rate characterizes the rate at which the output voltage of the driver PIP 171(2) changes in response to a change in input voltage. The term "slew bin" or "slew rate bin" refers to the range of values or the "bin" in which a particular slew rate value belongs. The ranges of values that correspond to the different bins may be chosen based on any technically feasible technique. The slew bin for the PIP partial context indicates which of these bins the slew rate associated with the PIP partial context should be included in. Slew values may be determined by modeling and/or simulation of the PIP partial context.

The capacitor bin for the PIP partial context is the bin for the capacitance "seen" by the output of the driver PIP 171(2), within the PIP partial context associated with the PIP-context being analyzed. As with the slew bin, the capacitor bin is a range of values in which the capacitance of driver PIP 171(2) is placed. As with slew values, this value can be obtained via modeling and/or simulation of the PIP partial context.

The dominant metal layer is the metal layer through which the majority of the pre-driver interconnect 176(1) and the driver interconnect 176(2) pass. The metal layers are the various metallization layers of IC 160 through which the different PIPs 171 and interconnects 176 (as well as other elements) may flow. In one example, the IC 160 may have 10 different metallization layers. The dominant metal layer indicates which of these 10 different layers the majority of the pre-driver interconnect 176(1) and driver interconnect 176(2) pass.

FIG. 2B is an illustration of PIP-context speed data 192, according to an example. PIP-context speed data 192 includes PIP-context speed data entries 214, which store characteristics that define the PIP-contexts 200 ("PIP-context type specifiers 210") and also data that identifies the associated PIP-context delay data 212. For any particular PIP-context speed data entry 214, the PIP-context type specifiers 210 specify a unique combination of PIP-context characteristics. The PIP-context characteristics include the characteristics described above with respect to FIG. 2A, and include driver PIP type, driver node type, pre-driver PIP type, pre-driver node type, dominant metal layer, tile crossing data, and slew and capacitor bins. The node delay data describes the delay across the driver node and the PIP delay data describes the delay across the driver PIP for the PIP-context identified by the PIP-context type specifiers 210. It is these delay values—the PIP-context delay data 212—that speed model tuning module 182 updates by performing the techniques described herein. Herein, the phrase "scaling a PIP-context," "applying a scale factor to a PIP-context," or similar language refers to multiplying both the node delay data and the PIP delay data by the specified scaling factor. PIP-context speed data 192 may store values for every possible combination of PIP-context characteristics, and thus for all possible PIP-contexts, which allows for accurate characterization of the speed of IC 160 when configured with circuit model 188.

Figure 3:
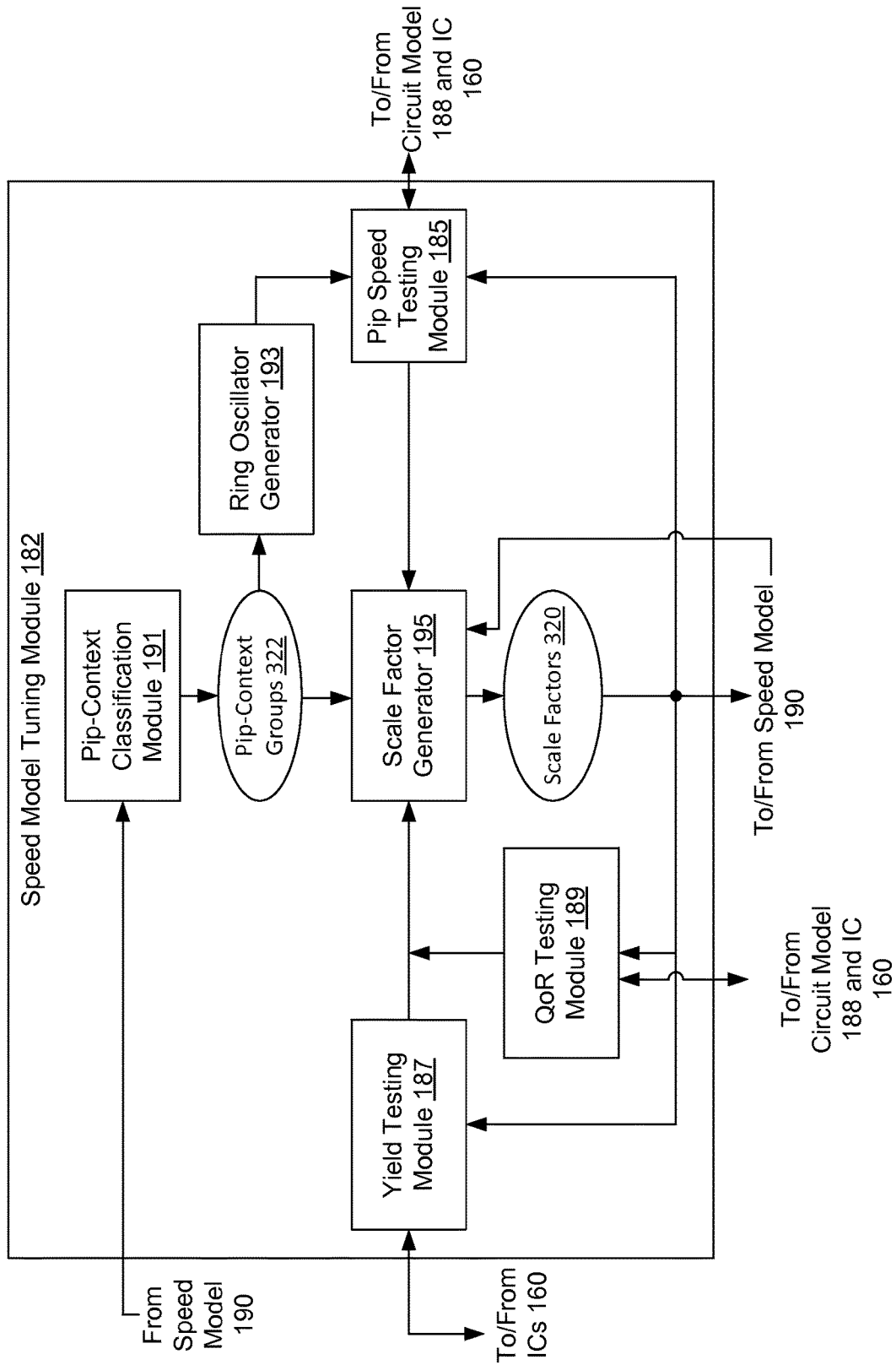
FIG. 3 is a block diagram of the speed model tuning module of FIG. 1B in more detail, according to an example.

FIG. 3 is a block diagram of the speed model tuning module 182 of FIG. 1B in more detail, according to an example. The speed model tuning module 182 includes multiple different modules that iteratively modify the speed model 190 as discussed above with respect to FIG. 1B.

Speed model tuning module 182 performs tests for yield (via yield testing module 187), QoR (via QoR testing module 189), and for determining over- and under-reports (via PIP speed testing module 185). Based on the results of these tests, speed model tuning module 182 generates scaling factors (via scale factor generator 195) that are used to update the PIP-context speed data 192. Note that the scaling factors (also called "scaling factors") generated for yield, QoR, and over- and under-reports all apply to PIP-contexts. However, in some implementations, the scale factors for yield may be given priority of QoR and over- and under-reports and the scale factors for QoR may be given priority over those for over- and under-reports. Thus, in a sense, the scale factors for over- and under-reports can be thought of as being "default" or "general" scale factors, as these scale factors are generated for every PIP-context, but are "over-ridden" by the scale factors for yield and QoR (which are not necessarily generated for every PIP-context). Testing and scale factors for each of these three items (yield, QoR, and over- and under-reports) will now be discussed in greater detail.

Yield testing module 187, QoR testing module 189, and PIP speed testing module 185 obtain measurements from one or more ICs 160 for provision to scale factor generator 195 in order to generate scale factors 320 for updating speed model 190. More specifically, yield testing module 187 obtains measurements of the speed of "speed binning rings," which are pre-designed circuits that are characteristic of the speed of the interconnect fabric of IC 160. QoR testing module 189 obtains measurements of the speed of "QoR circuits," which are circuits that characterize the speed of the circuit model 188. PIP speed testing module 185 obtains measurements of one PIP context for each PIP-context group (which may be referred to herein as a "group-representative PIP-context"). More specifically, PIP speed testing module 185 measures the speed of PIP-context ring oscillators, which are generated by ring oscillator generator 193 for measuring the speed of the group-representative PIP-contexts. In each iteration, scale factor generator 195 may consider measurements from each of yield testing module 187, QoR testing module 189, and PIP speed testing module 185 in generating scale factors 320.

Yield testing module 187 obtains measurements from speed binning rings. The speed binning rings are pre-constructed and are deemed to be appropriately characteristic of the speed of the interconnect fabric of IC 160. Speed binning rings may include various elements of the IC 160, including PIPs 171, interconnects 176, and logic elements of CLBs 162. Yield testing module 187 obtains measurements of the speed binning rings by configuring the speed binning rings into IC 160 via IC configuration module 186, asserting an enable signal, and determining the number of times the speed binning rings oscillate during a certain period of time (a "yield testing time"). Yield testing module 187 then obtains the delay across the entire ring by dividing the yield testing time by the number of times the speed binning ring oscillates. Yield testing module 187 obtains the delay for each speed binning ring and forwards those delays to scale factor generator 195 for further processing. Yield testing module 187 may test the same speed binning rings on multiple ICs 160. If yield testing module 187 does this, then yield testing module obtains a range of speed binning ring measurements by, for each speed binning ring, calculating the mean and standard deviation of the delay for that speed binning ring across the different ICs 160. The range for each speed binning ring would be mean±(one) standard deviation.

QoR testing module 189 tests QoR-related circuits in IC 160. The QoR-related circuits are circuits that affect the maximum frequency with which the IC 160 can run when configured with the circuit model 188. In one example, the QoR-related circuits are circuits between two clocked storage elements (e.g., flip flops) that exhibit the highest amount of delay out of any other circuit that lies between those two clocked storage elements. In one more specific example, the circuit model 188 may include an instruction pipeline of a microcontroller. Each stage in the instruction pipeline has input flip flops and output flip flops. Multiple sequences of logic and interconnect elements may exist between each input flip flop and output flip flop. The sequence with the highest delay is considered the QoR-related circuit for that particular pair of input flip flop and output flip flop. To fully test a circuit model 188, QoR testing module 189 tests each QoR-related circuit for the circuit model 188. Once measurements for each such QoR-related circuit are taken, QoR testing module 189 provides those QoR testing measurements to scale factor generator 195 for further processing.

QoR testing module 189 may test QoR circuits using one of two techniques. In one technique, once the QoR circuits are selected, QoR testing module 189 instructs IC configuration module 186 to configure a QoR ring oscillator that includes a QoR circuit into the integrated circuit 160. The QoR ring oscillator would include the QoR circuit and additional elements to "close the loop" in order to form a ring oscillator. The QoR ring oscillator would also include additional logic elements for making the output oscillate and any other elements desired, such as interconnects 176 and/or PIPs 171. The frequency of the signal output by the QoR ring oscillator is the measured speed for the ring oscillator. In another technique, IC configuration module would configure all or part of circuit model 188 that includes the particular QoR circuit to be tested and would repeatedly raise the clock speed until the output of the QoR circuit no longer produces stable results. Stable results are predictable results that are produced when the clock speed is slow enough that a signal entering the input of a QoR circuit has enough time to propagate to and thus modify the voltage of the output of the QoR circuit. If the clock speed is too fast, this process cannot happen and the QoR is considered to be unstably operating. QoR testing module 189 determines the delay across the QoR circuit as the reciprocal of the clock frequency at which the transition from stable to unstable operation occurs.

As with yield testing module 187, QoR testing module 189 obtains the delay for each QoR circuit and forwards those delays to scale factor generator 195 for further processing. QoR testing module 189 may test the same QoR circuits on multiple ICs 160. If QoR testing module 189 does this, then QoR testing module 189 obtains a range of delay values by, for each QoR circuit, calculating the mean and standard deviation of the delay for that QoR circuit across the different ICs 160. The range for each speed binning ring would be mean±(one) standard deviation.

For over- and under-reports, the number of possible PIP-contexts may be quite large. Thus, in order to reduce the number of PIP-contexts that are tested, PIP-context classification module 191 classifies PIP-contexts into PIP-context groups. These PIP-context groups are deemed to be sufficiently similar that a scale factor for one PIP-context in a particular group is applied to all other PIP-contexts in the same PIP-context group. Thus, forming these groupings reduces the number of PIP-contexts that are tested.

Forming these groups is an iterative process. More specifically, to form these groupings, speed model tuning system 180 selects a number of PIP-context characteristics (discussed above with respect to FIGS. 2A and 2B) and identifies all PIP-contexts that have the same values for each of the selected characteristics. For example, speed model tuning system 180 may select the characteristics of PIP type, driver interconnect type, and pre-driver interconnect type (which, together, constitute a subset of the characteristics that PIP-contexts may have). Speed model tuning system 180 forms candidate groups that each include all PIP-contexts 200 (i.e., combinations of PIP-context characteristics) that have the same values for those selected characteristics.

Speed model tuning system 180 then determines whether the candidate grouping that has been constructed is a "valid" candidate grouping. More specifically, speed model tuning system 180 statistically analyzes the stored delay values (stored in PIP-context speed data 192) for the PIP-contexts in each candidate grouping, calculating means and standard deviations for the PIP-contexts in each candidate grouping. If the standard deviation for all candidate groupings is below a threshold, then speed model tuning system 180 deems the candidate grouping to be valid. If the standard deviation is not below a threshold for all candidate groupings, then speed model tuning system 180 chooses different characteristics from which to form candidate groupings. This technique is repeated until the candidate groupings are deemed to be valid.

To obtain measurements for over- and under-reports, PIP speed testing module 185 obtains the delay of ring oscillators that include PIP-contexts to be measured. More specifically, PIP speed testing module 185 measures one ring oscillator for each PIP-context group generated by PIP-context classification module 191. Each ring oscillator includes a PIP-context from a different PIP-context group so that measuring multiple ring oscillators effectively measures speed of representative PIP-contexts for each PIP-context group.

To measure the ring oscillators, ring oscillator generator 193 generates speed-testing ring oscillators, based on the pip-context groups 322 that are generated by PIP-context classification module 191. Ring oscillator generator 193 generates a ring oscillator for each PIP-context group, where each ring oscillator includes a PIP-context that is within the associated PIP-context group. Ring oscillator generator 193 provides the generated ring oscillators to PIP speed testing module 185 for testing.

PIP speed testing module 185 accepts the ring oscillators from ring oscillator generator 193 and configures IC 160 with the ring oscillators to test the speed of the associated PIP-contexts. The ring oscillators include a PIP-context to be tested as well as other components formed from configurable logic elements of a CLB 162, all formed into a ring oscillator. The ring oscillator includes an enable input and an oscillation frequency output. When the enable input is asserted, a signal propagates around the ring oscillator. The delay of the ring oscillator is based on the aggregate delay of all elements in the ring oscillator. Thus, the frequency of the output is dependent on the speed of these elements, which includes the PIP-context that is tested. To obtain a measurement from the different ring oscillators, PIP speed testing module 185 enables each ring oscillator for a specific period of time (a "testing period") and determines how many times the ring oscillator oscillates in the testing period. To determine the delay of the ring oscillator, PIP speed testing module 185 divides the testing period by the number of times the ring oscillator oscillates.

In one example of a ring oscillator, the ring oscillator may include an AND gate (which may, in some implementations be an "AND2i" gate, which is a two-input AND gate with an inverting input) with an inverting input and a non-inverting input, as well as the PIP-context to be tested (including two PIPs 171 and two interconnects 176) and another PIP-interconnect pair, configured in a ring. Asserting the non-inverting input of the AND gate causes a signal to propagate around the ring oscillator at a frequency that is characteristic of the delay of the PIP-context. The frequency of the ring oscillator may be measured at any point. In one example, to measure the frequency of the ring oscillator, another ring with a clocked element such as a flip flop and an inverter is coupled to a point in the ring oscillator. The flip flop is clocked by the output of the ring oscillator, and the data in the flip flop is inverted by the inverter and fed back to the data input of the flip flop. The output of the flip flop ring is used to clock a counter, which thus stores a count of the number of times the ring oscillator oscillates in a given period of time.

PIP speed testing module 185 provides the PIP-context measurements (i.e., measurements for over- and under-reports) to the scale factor generator 195 for generating scale factors 320. As with yield and QoR, PIP speed testing module 185 may obtain measurements from multiple ICs 160, may determine the mean and standard deviation for the measurements, and may provide the range mean±(one) standard deviation to scale factor generator 195 for processing.

Scale factor generator 195 accepts the yield measurements from yield testing module 187, the PIP-context measurements from the PIP speed testing module 185, and the QoR testing measurements from QoR testing module 189 and generates scale factors 320 for updating speed model 190. The scale factors are in the form of a fraction or a percentage. Speed model 190 updates the PIP-context speed data 192 (including the node delay data and PIP delay data within the PIP-context delay data 212) by multiplying the delay values by the scaling factors 320. Further details related to generating the scale factors 320 are provided with respect to FIGS. 4A and 4B.

Figure 4A:
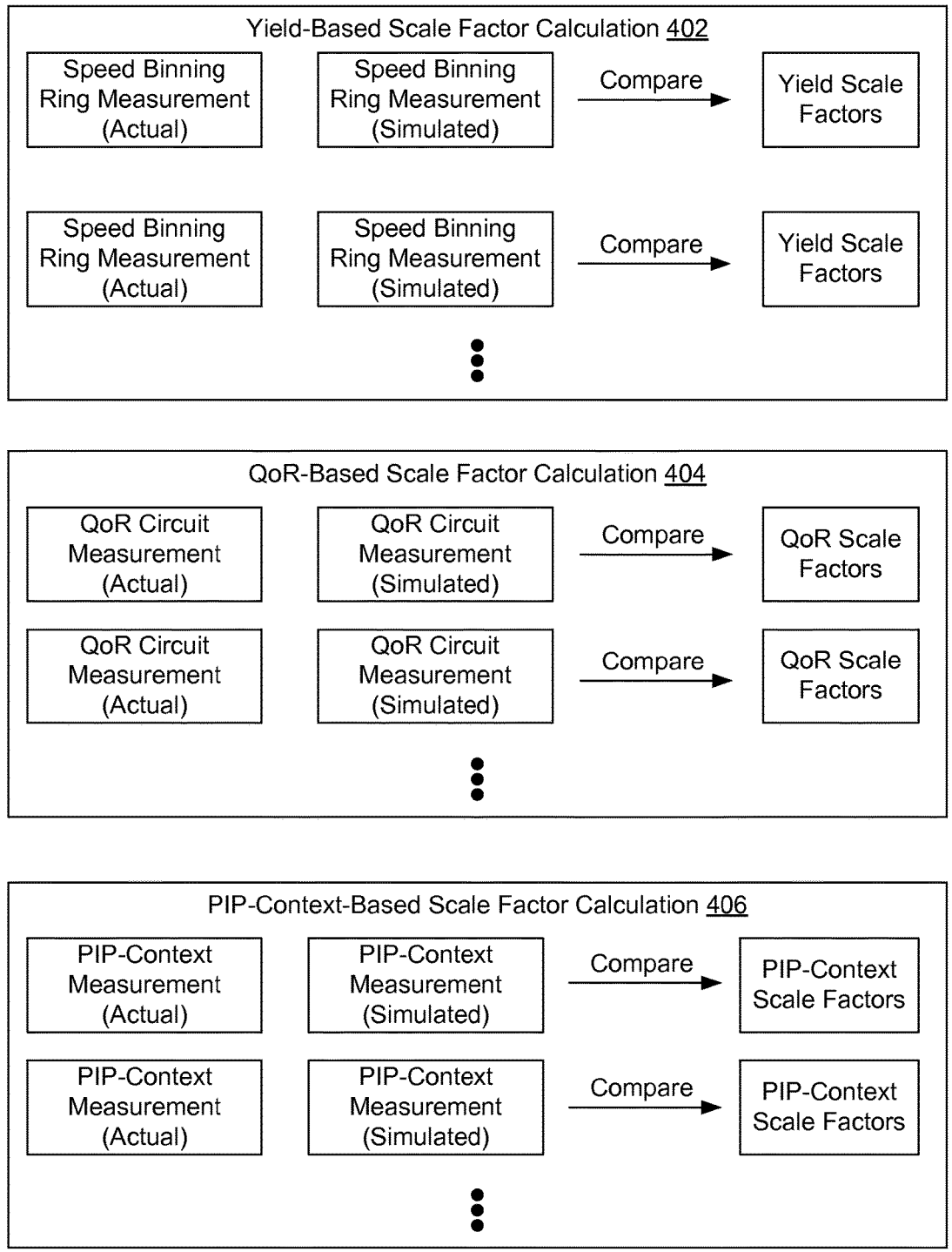
FIG. 4A is a block diagram illustrating the generation of yield-based scale factors, quality-of-results (QoR) based scale factors, and PIP-context-based scale factors, according to an example.

FIG. 4A is a block diagram illustrating the generation of yield-based scale factors 402, QoR-based scale factors 404, and PIP-context-based scale factors 406, according to an example. More specifically, FIG. 4A illustrates generation of these scale factors based on the measurements provided by PIP speed testing module 185, yield testing module 187, and QoR testing module 189.

For yield-based scale factor calculation 402, scale factor generator 195 compares an actual speed binning ring measurement with a simulated speed binning ring measurement. As described above, a speed binning ring includes multiple elements such as PIPs 171, interconnects 176, and function generators within CLBs 162. The actual measurement is the measurement of the delay of the speed binning ring taken by yield testing module 187. Scale factor generator 195 generates the simulated value by obtaining the estimated delays for all elements within the speed binning ring from the speed model 190 and adding those estimated delays together. Estimated delays are delays stored in speed model 190. For each speed binning ring, scale factor generator 195 compares the actual value to the simulated value to generate a scaling factor. More specifically, scale factor generator 195 generates a scaling factor that is based on the degree to which the estimated delay differs from the actual delay. In one example, the scaling factor is generated based on the following: speed binning ring scale factor=1+ $(Delay_{simulated}-Delay_{Actual})/Delay_{Actual}$.

Scale factor generator 195 calculates yield scale factors for each PIP-context included in yield-critical speed binning rings. A speed binning ring is considered to be yield-critical if the measured delay for that yield binning ring is one of the N highest measured delays out of all yield binning rings. Note that if speed binning rings are measured in multiple ICs 160, then the delay measurement from the multiple ICs 160 for any particular speed binning ring are averaged together to obtain a mean delay value for those ICs 160. Then, the N highest yield binning ring delays out of the mean delay values are chosen.

For any particular speed binning ring, scale factor generator 195 generates a scale factor each PIP-context within that particular yield-critical speed binning ring based on the degree to which the estimated delay differs from the actual delay as described above. More specifically, scale factor generator 195 assigns that scaling factor to each PIP-context within the yield-critical speed binning ring. Additionally, scale factor generator 195 may adjust the particular scaling factor applied to any particular PIP-context within a yield-critical speed binning ring based on the relative delay values of the PIP-contexts in that yield-critical speed binning ring. More specifically, scale factor generator 195 may amplify or shrink the scaling factor for PIP-contexts that have a smaller delay than the delay of the PIP-context with the largest delay in a particular speed binning ring. Amplifying or shrinking the scaling factor would bring that scaling factor closer to 1, so that the speed data of the PIP-context is changed by a smaller degree. In one example, the delay for a PIP-context is compared to the highest delay of a PIP-context within the same yield-critical speed binning ring. The scaling factor is then modified based on the ratio of the delay of the first PIP-context to the highest delay in the yield-critical speed binning ring. The scaling factor is modified to be closer to 1 by this ratio. For example, if a first PIP-context is equal to half of the delay of the highest-delay PIP-context, then the scaling factor for the first PIP-context is modified to be halfway between the scaling factor of the highest-delay PIP-context and 1.

After performing the above operations, scale factor generator 195 determines whether multiple speed binning rings include the same PIP-contexts. If multiple speed binning rings include the same PIP-context, then scale factor generator 195 determines the yield-based scaling factor for that particular PIP-context as the mean of the scaling factors for that PIP-context from the different speed binning rings. For example, if the scale factor for a particular PIP-context from one yield-critical speed binning ring is 1.1 and the scale factor for the same PIP-context in a different yield-critical speed binning ring is 1.2, then scale factor generator 195 would calculate the mean—1.15—and use that mean as the scale factor for that PIP-context.

Figure 4B:
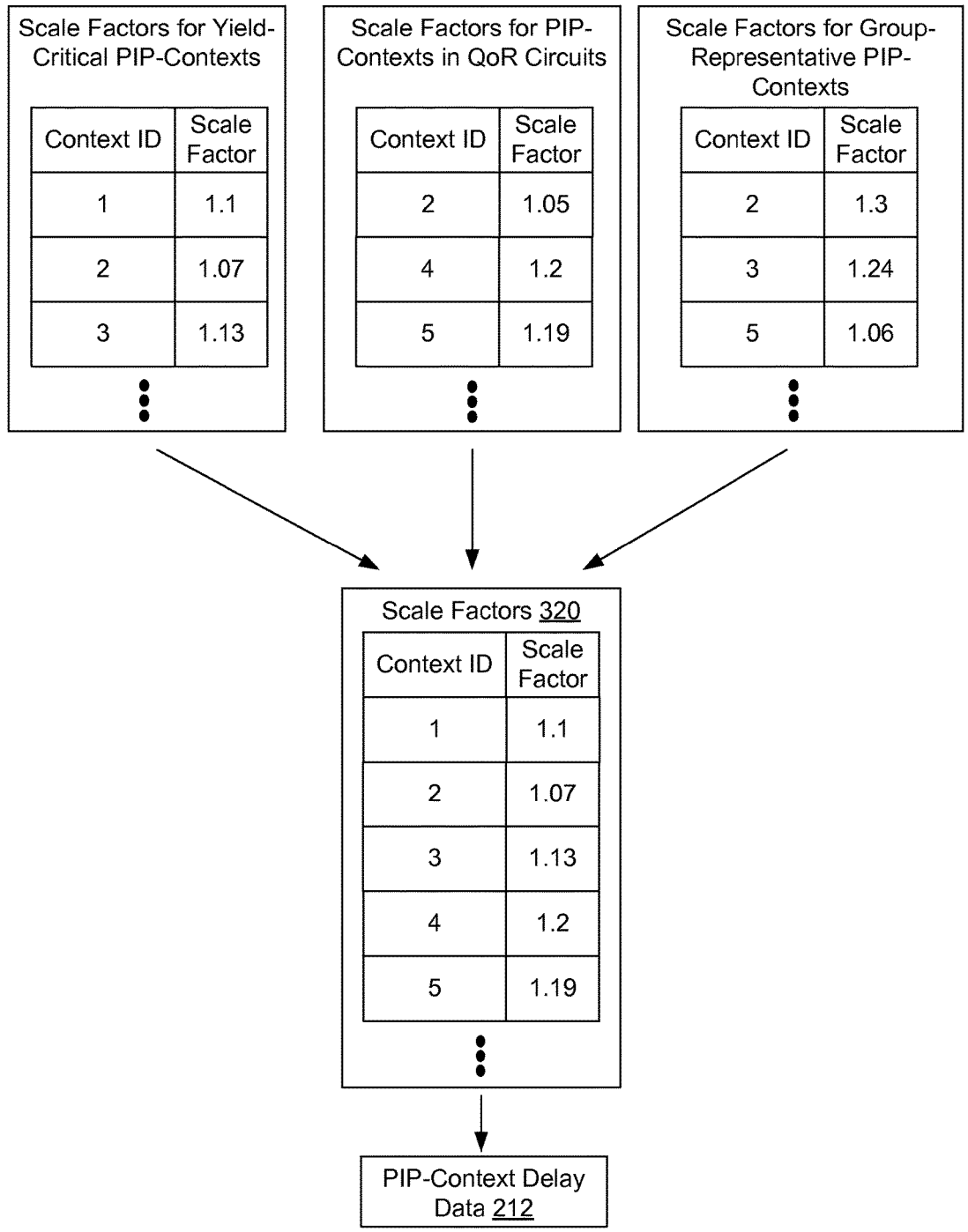
FIG. 4B is a block diagram illustrating the combination of scale factors, according to an example.

For QoR-based scale factor calculation 404, scale factor generator 195 compares an actual QoR circuit measurement with a simulated QoR circuit measurement. The actual measurement is the measurement of the delay through the QoR circuit taken by QoR testing module 189 and the simulated measurement is the sum of the estimated delays (stored in speed model 190) in that QoR, based on speed model 190. For each QoR circuit, scale factor generator 195 compares the actual value to the simulated value to generate a scaling factor. More specifically, scale factor generator 195 generates a scaling factor that is based on the degree to which the estimated delay differs from the actual delay. In one example, the scaling factor is generated based on the following: QoR-based scale factor=$1+(\text{Delay}_{simulated}-\text{Delay}_{Actual})/\text{Delay}_{Actual}$. FIG. 4B illustrates how the scale factors for PIP-contexts in the QoR circuits are used to generate the overall scale factors 320.

Scale factor generator 195 calculates QoR-based scale factors for each PIP-context included in QoR circuits. Note that if QoR circuits are measured in multiple ICs 160, then the delay measurement from the multiple ICs 160 for any particular QoR circuits are averaged together to obtain a mean delay value for those ICs 160.

Scale factor generator 195 generates a QoR circuit scale factor for each PIP-context within a particular QoR circuit. As with the yield-based scale factors, scale factor generator 195 may adjust the scaling factor based on the relative delay values of the PIP-contexts in a QoR circuit.

If multiple QoR circuits include the same PIP-context, then scale factor generator 195 calculates the mean for all of the scaling factors for that PIP-context and uses that mean as the actual delay ("$\text{Delay}_{Actual}$") discussed above. For example, if the scale factor for a particular PIP-context from one QoR circuit is 1.1 and the scale factor for the same PIP-context in a different QoR circuit is 1.2, then scale factor generator 195 would calculate the mean—1.15—and use that mean as the scale factor for that PIP-context.

For scale factor calculation for over- and under-reports (PIP-context-based scale factor calculation 406), scale factor generator 195 compares an actual PIP-context ring oscillator measurement with a simulated PIP-context ring measurement. The actual delay is the measurement of the delay through the ring oscillator for measuring the particular PIP-context taken by PIP speed testing module 185 and the simulated delay is the sum of the estimated delays (stored in speed model 190) of all of the elements of that ring oscillator. For each measured ring oscillator, scale factor generator 195 compares the actual value to the simulated value to generate a scaling factor. More specifically, scale factor generator 195 generates a scaling factor that is based on the degree to which the estimated delay differs from the actual delay. In one example, the scaling factor is generated based on the following: Scale factor=$1+(\text{Delay}_{simulated}-\text{Delay}_{Actual})/\text{Delay}_{Actual}$. FIG. 4B illustrates how the scale factors for PIP-context group representative PIP-contexts are used to generate the overall scale factors 320.

In generating the above scale factors (those for over- and under-reports), if measurements were taken from multiple ICs 160, the mean value is used for the actual delay values.

Scale factor generator 195 calculates PIP-context scale factors for each PIP-context included in the ring oscillators. Note that if a particular ring oscillator is measured in multiple ICs 160, then the delay measurement from the multiple ICs 160 for any particular ring oscillator are averaged together to obtain a mean delay value for those ICs 160.

Scale factor generator 195 generates the speed binning ring scale factor for each PIP-context within a particular ring oscillator. Scale factor generator 195 may adjust the scaling factor based on the relative delay values of the PIP-contexts in a ring oscillator, as described above with respect to yield and QoR.

If multiple ring oscillators include the same PIP-contexts, then scale factor generator 195 calculates the mean for all of the scaling factors for that PIP-context. For example, if the scale factor for a particular PIP-context from one ring oscillator is 1.1 and the scale factor for the same PIP-context in a different ring oscillator is 1.2, then scale factor generator 195 would calculate the mean—1.15—and use that mean as the scale factor for that PIP-context.

In FIG. 4B, scale factor generator 195 combines the scale factors for yield, QoR, and group-representative PIP-contexts to generate scale factors 320. More specifically, scale factor generator 195 aggregates the scale factors from yield, QoR and group-representative PIP-contexts to generate the scale factors 320. Thus, scale factors 320 includes the scale factors from yield-based, QoR-based, and group-representative PIP-context based scale factors.

An example of the manner in which scale factors are aggregated is now provided. In aggregating the scale factors, scale factor generator 195 gives priority to yield-critical PIP-context scale factors over both QoR circuit PIP-context scale factors and group-representative PIP-context scale factors, and gives priority to QoR circuit PIP-context scale factors over group-representative PIP-context scale factors. Thus, for any particular PIP-context, if a scale factor exists for a yield-based PIP-context and also for either or both of the QoR circuits and the group-representative PIP-contexts, then scale factors 320 only includes the scale factor for the yield-critical PIP-contexts. Similarly, if a scale factor is included for both QoR circuits and group-representative PIP-contexts (but not for yield-based PIP-contexts), then scale factors 320 only includes the scale factor for the QoR circuits. If a scale factor is included only in group-representative PIP-contexts, then scale factors 320 includes that scale factor. Note that various ways of generating and aggregating scale factors may be used and the manner of aggregation of scale factors is not limited to the disclosure provided herein. For example, scale factors from different circuit types may be given different priorities than those described herein.

Once scale factor generator 195 has generated scale factors 320, scale factor generator 195 transmits the scale factors 320 to the speed model 190 to update speed model 190. To update speed model 190, the delay data (node delay data and PIP delay data) are multiplied by the scale factors in the scale factors 320. More specifically, each scale factor is associated with a particular PIP-context (alternately, each scale factor can be thought of as being the scale factor "for" a particular PIP-context). After aggregating the QoR scale factors, yield scale factors and PIP-context scale factors, speed model tuning module 182 applies each scale factor to its respective PIP-context, thus scaling up or down the delay associated with that particular PIP-context within PIP-context speed data 192. For scale factors that derive from over- and under-reports, speed model tuning module 182 applies the scale factors to all PIP-contexts in the PIP-context group for which a scale factor exists. Once the PIP-contexts are updated by their respective scale factors, the current iteration ends and, if the delays for PIP-contexts are not considered to be sufficiently accurate, a new iteration begins. Delays are considered to be sufficiently accurate if yield values are within yield targets, QoR values are within QoR targets, and the PIP-speed measurements are within a preset threshold of estimated PIP-speed measurements for all PIP groups.

Figure 5:
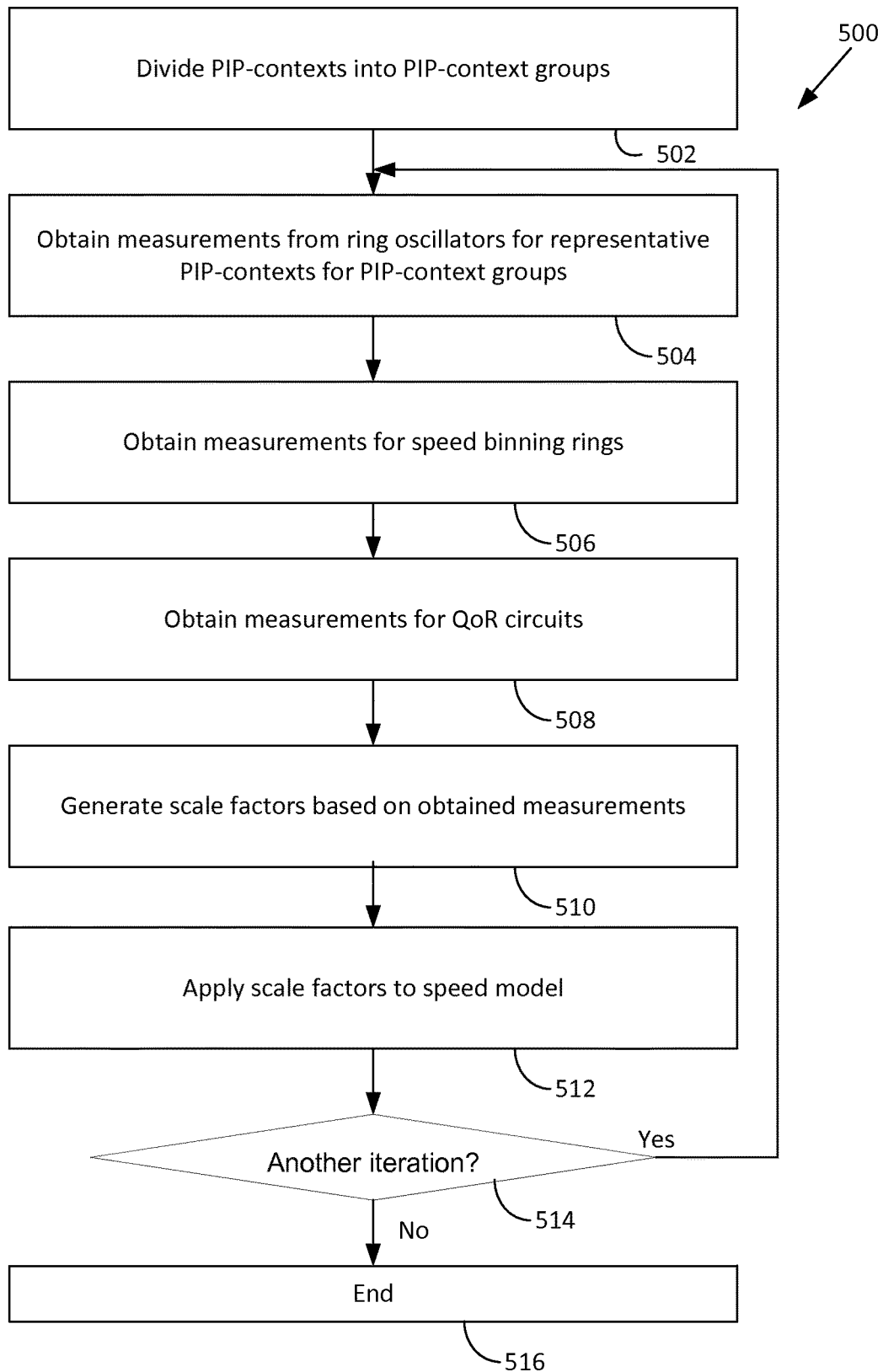
FIG. 5 is a flow diagram of method operations for updating a speed model for an integrated circuit, according to an example.

FIG. 5 is a flow diagram of method operations for updating a speed model for an integrated circuit 160, according to an example. Although described in conjunction with the system of FIGS. 1A-4B, those of skill in the art will realize that any entity that performs the operations, in any technically feasible order, would be within the scope of the present disclosure.

At operation 502, PIP-context classification module 191 groups PIP-contexts into PIP-context groups. At operation 504, PIP speed testing module 185 obtains measurements from ring oscillators for representative PIP-contexts for the PIP-context groups. At operation 506, yield testing module 187 obtains measurements for speed binning rings for yield-based measurements. At operation 508, QoR testing module 189 obtains measurements for the QoR circuits. At operation 510, scale factor generator 195 calculates scale factors from the measurements. At operation 512, speed model 190 applies the scale factors to the delay data for the PIP-contexts. At operation 514, speed model tuning module 182 determines whether another iteration is to be performed. If another iteration is to be performed, then the method 500 returns to operation 504. If another iteration is not to be performed, then the method 500 proceeds to operation 516 where the method 500 ends.

Note that although various specific logic gates are described herein, those of skill in the art will recognize that other logic gates may or electrical components that perform an analogous function may instead be substituted.

Although signals are sometimes described herein as having a particular logical value—i.e., high or low (or "0" or "1" or some equivalent), those of skill in the art will recognize that for any particular signal, polarities may be reversed. For example, a signal that, when brought high, has a particular effect, may alternatively have that particular effect when brought low.

The various examples described herein may employ various computer-implemented operations involving data stored in computer systems. For example, these operations may require physical manipulation of physical quantities—usually, though not necessarily, these quantities may take the form of electrical or magnetic signals, where they or representations of them are capable of being stored, transferred, combined, compared, or otherwise manipulated. Further, such manipulations are often referred to in terms, such as producing, identifying, determining, or comparing. Any operations described herein that form part of one or more example implementations may be useful machine operations. In addition, one or more examples also relate to a device or an apparatus for performing these operations. The apparatus may be specially constructed for specific required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The various examples described herein may be practiced with other computer system configurations including handheld devices, microprocessor systems, microprocessor-based or programmable consumer electronics, minicomputers, mainframe computers, and the like.

One or more examples may be implemented as one or more computer programs or as one or more computer program modules embodied in one or more computer readable media. The term computer readable medium refers to any data storage device that can store data which can thereafter be input to a computer system-computer readable media may be based on any existing or subsequently developed technology for embodying computer programs in a manner that enables them to be read by a computer. Examples of a computer readable medium include a hard drive, network attached storage (NAS), read-only memory, random-access memory (e.g., a flash memory device), a Compact Disc (CD)-ROM, a CD-R, or a CD-RW, a DVD (Digital Versatile Disc), a magnetic tape, and other optical and non-optical data storage devices. The computer readable medium can also be distributed over a network coupled computer system so that the computer readable code is stored and executed in a distributed fashion.

While the foregoing is directed to specific example implementations, other and further example implementations may be devised without departing from the basic scope thereof, and the scope thereof is determined by the claims that follow.

What is claimed is:

1. A method for tuning a speed model, the method comprising:
   taking over-and-under-report measurements for programmable-interconnect-point (PIP)-contexts of an integrated circuit;
   taking yield-based speed measurements associated with the integrated circuit;
   taking quality-of-results (QoR)-based speed measurements associated with a circuit model for being programmed into the integrated circuit; and
   generating scale factors for the PIP-contexts of the integrated circuit based on the over-and-under-report measurements, the yield-based speed measurements, and the QoR-based speed measurements.

2. The method of claim 1, further comprising:
   sorting PIP-contexts associated with the integrated circuit into PIP-context groups,
   wherein the taking over-and-under-report measurements comprises taking over-and-under-report measurements for one PIP-context of different PIP-context groups.

3. The method of claim 1, wherein:
   the over-and-under-report measurements for PIP-contexts comprise measurements of ring oscillators including at least one PIP-context to be measured and configured into the integrated circuit;
   the yield-based speed measurements comprise measurements of speed binning rings configured into the integrated circuit; and
   the QoR-based speed measurements comprise measurements of QoR-critical circuits configured into the integrated circuit.

4. The method of claim 1, wherein:
   the generating scale factors comprises generating the scale factors based on the over-and-under-report measurements by comparing the over-and-under-report measurements to simulated over-and-under-report measurements;
   the generating scale factors comprises generating the scale factors based on the yield-based measurements by comparing the yield-based measurements to simulated yield-based measurements; and
   the generating scale factors comprises generating the scale factors based on the QoR-based measurements by comparing the QoR-based measurements to simulated QoR-based measurements.

5. The method of claim 1, wherein:
   the generating scale factors comprises generating the scale factors by affording priority to yield-related scale factors over both QoR-related scale factors and over-and-under-report-related scale factors and by affording priority to QoR-related scale factors over over-and-under-report-related scale factors.

6. The method of claim 1, wherein:
   the PIP-contexts are characterized by a set of PIP-related characteristics.

7. The method of claim 6, wherein:
the PIP-related characteristics include one or more of driver PIP type, driver node type, pre-driver PIP type, and pre-driver node type.

8. The method of claim 1, further comprising:
scaling PIP-context speed data by multiplying PIP delay and node delay associated with the PIP-contexts by the scale factors.

9. The method of claim 1, wherein:
the generating scale factors comprises generating the scale factors in an iterative manner.

10. The method of claim 1, wherein:
the generating scale factors comprises averaging scale factors for a PIP-context of the PIP-contexts obtained from multiple yield-based speed measurements, multiple QoR-based speed measurements, or multiple over-and-under-report measurements.

11. A speed model tuning system comprising:
a speed model tuning module, comprising:
  a programmable-interconnect-point (PIP) speed testing module operable to take over-and-under-report measurements for PIP-contexts of an integrated circuit,
  a yield testing module operable to take yield-based speed measurements associated with the integrated circuit,
  a quality-of-results (QoR) testing module operable to take QoR-based speed measurements associated with a circuit model for being programmed into the integrated circuit, and
  a scale factor generator operable to generate scale factors for the PIP-contexts of the integrated circuit based on the over-and-under-report measurements, the yield-based speed measurements, and the QoR-based speed measurements.

12. The speed model tuning system of claim 11, wherein the speed model tuning module further comprises:
a PIP-context classification module operable to sort PIP-contexts associated with the integrated circuit into PIP-context groups,
wherein the PIP speed testing module is further operable to take the over-and-under-report measurements for one PIP-context of different PIP-context groups.

13. The speed model tuning system of claim 11, wherein:
the over-and-under-report measurements for PIP-contexts comprise measurements of ring oscillators including at least one PIP-context to be measured and configured into the integrated circuit;
the yield-based speed measurements comprise measurements of speed binning rings configured into the integrated circuit; and
the QoR-based speed measurements comprise measurements of QoR-critical circuits configured into the integrated circuit.

14. The speed model tuning system of claim 11, wherein:
the scale factor generator is operable to generate the scale factors based on the over-and-under-report measurements by comparing the over-and-under-report measurements to simulated over-and-under-report measurements;
the scale factor generator is operable to generate the scale factors based on the yield-based measurements by comparing the yield-based measurements to simulated yield-based measurements; and
the scale factor generator is operable to generate the scale factors based on the QoR-based measurements by comparing the QoR-based measurements to simulated QoR-based measurements.

15. The speed model tuning system of claim 11, wherein the scale factor generator is operable to generate the scale factors by affording priority to yield-related scale factors over both QoR-related scale factors and over-and-under-report-related scale factors and by affording priority to QoR-related scale factors over over-and-under-report-related scale factors.

16. The speed model tuning system of claim 11, wherein:
the PIP-contexts are characterized by a set of PIP-related characteristics.

17. The speed model tuning system of claim 16, wherein:
the PIP-related characteristics include one or more of driver PIP type, driver node type, pre-driver PIP type, and pre-driver node type.

18. The speed model tuning system of claim 11, wherein:
the speed model tuning module is operable to scale PIP-context speed data by multiplying PIP delay and node delay associated with the PIP-contexts by the scale factors.

19. The speed model tuning system of claim 11, wherein:
the PIP speed testing module, the yield testing module, the QoR testing module, and the scale factor generator are operable to cooperate to generate the scale factors in an iterative manner.

20. The speed model tuning system of claim 11, wherein:
the scale factor generator is operable to generate the scale factors by averaging scale factors for a PIP-context of the PIP-contexts obtained from multiple yield-based speed measurements, multiple QoR-based speed measurements, or multiple over-and-under-report measurements.

* * * * *